United States Patent
Kamono

(10) Patent No.: US 7,342,640 B2
(45) Date of Patent: Mar. 11, 2008

(54) EXPOSURE APPARATUS AND METHOD

(75) Inventor: Takashi Kamono, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/548,021

(22) Filed: Oct. 10, 2006

(65) Prior Publication Data

US 2007/0081135 A1    Apr. 12, 2007

(30) Foreign Application Priority Data

Oct. 11, 2005   (JP)   ............... 2005-296959

(51) Int. Cl.
*G03B 27/42*   (2006.01)
*G03B 27/52*   (2006.01)

(52) U.S. Cl. ......................... 355/53; 355/30
(58) Field of Classification Search .................. 355/30, 355/53, 55, 67; 250/548; 356/399–401
See application file for complete search history.

(56) References Cited

U.S. PATENT DOCUMENTS

| | | | | |
|---|---|---|---|---|
| 5,610,683 | A * | 3/1997 | Takahashi | 355/53 |
| 6,762,821 | B2 | 7/2004 | Kamono | 355/30 |
| 2002/0011207 | A1 | 1/2002 | Uzawa et al. | |
| 2005/0048220 | A1 * | 3/2005 | Mertens et al. | 427/553 |
| 2005/0225735 | A1 | 10/2005 | Magome et al. | 355/30 |
| 2005/0275998 | A1 | 12/2005 | Kamono | 361/234 |
| 2006/0257553 | A1 * | 11/2006 | Ohta et al. | 427/8 |
| 2007/0081135 | A1 | 4/2007 | Kamono | 355/53 |

FOREIGN PATENT DOCUMENTS

| | | |
|---|---|---|
| JP | 6-124873 | 5/1994 |
| JP | 2002-057100 | 2/2002 |
| WO | WO 99/49504 | 9/1999 |

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus to expose a substrate to light with a space between a projection optical system and the substrate filled with liquid. The apparatus has a stage to hold the substrate and to move, a supply unit to supply the liquid to the space, a recovery unit to recover the liquid from the space, a detector to detect a droplet of the liquid on at least one of the substrate and the stage, a removing unit configured to remove the droplet on the substrate detected by the detector, the removing unit including a slit-shaped nozzle arranged so as to vertically sandwich the substrate and blowing a gas on the substrate from the nozzle, a calculation unit to calculate at least one of a position and size of the droplet detected by the detector, and a controller to control a relative velocity between the nozzle and the substrate based on the calculation result of the calculation unit.

3 Claims, 12 Drawing Sheets

WAFER SCANNING DIRECTION

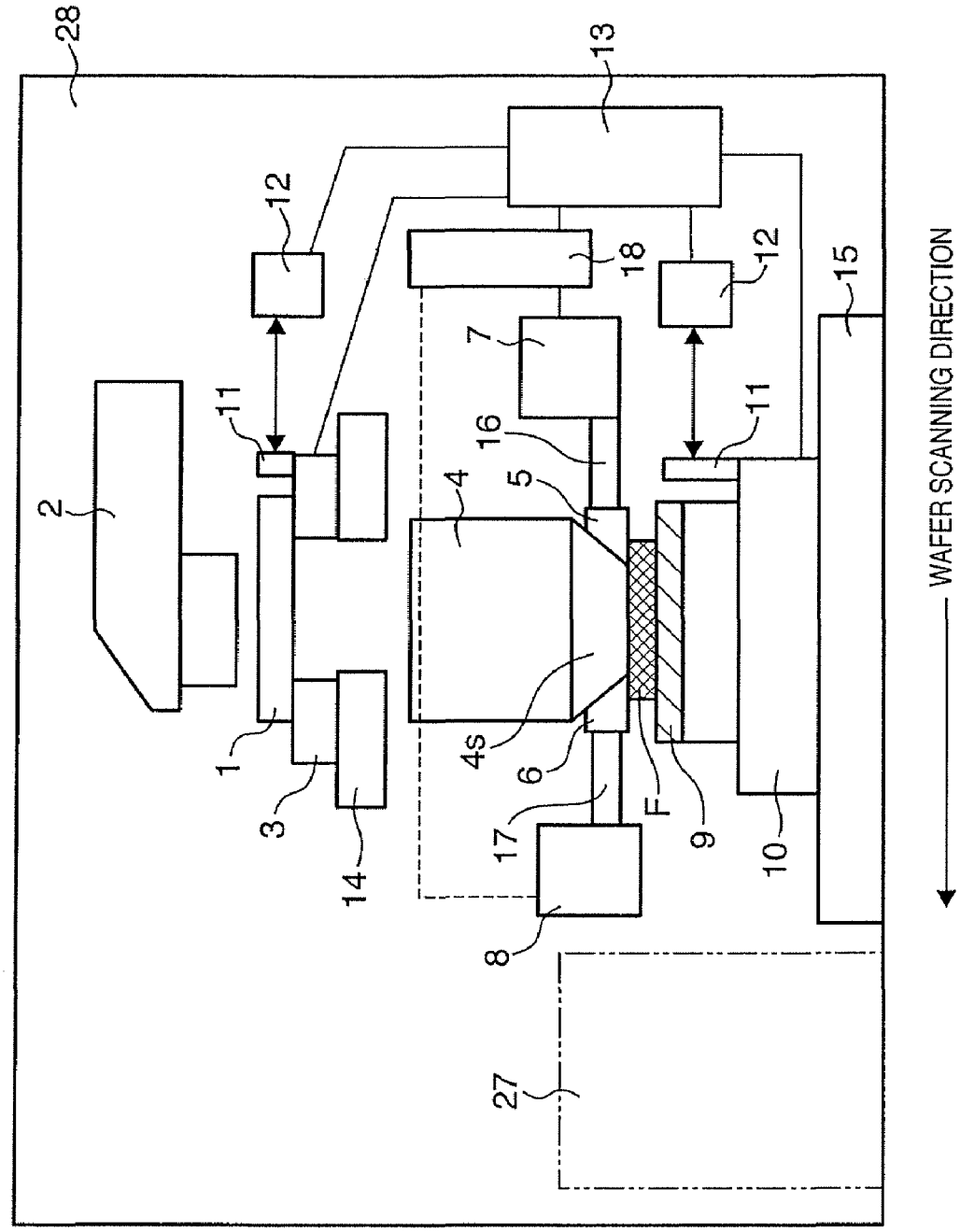

COATING/DEVELOPING DEVICE

COATING/DEVELOPING DEVICE

EXPOSURE APPARATUS AND METHOD

BACKGROUND OF THE INVENTION

1. Field of the Invention

The present invention relates to, e.g., an exposure apparatus for exposing a substrate to light to manufacture a device, such as a semiconductor device or a liquid crystal display device and, more particularly, to an exposure apparatus using a liquid immersion method.

2. Description of the Related Art

A process for manufacturing a semiconductor device formed from the micropattern of an LSI or a VLSI adopts a reduction projection exposure apparatus, which reduces a pattern formed on a mask and projects and transfers it onto a substrate coated with a photosensitive agent. As the degree of integration of a semiconductor device increases, further micropatterning becomes necessary. The exposure apparatus has coped with micropatterning at the same time as the development of the resist process.

As an implement for increasing the resolution of an exposure apparatus, it is common practice to shorten the exposure wavelength or to increase the numerical aperture (NA) of a projection optical system.

As for the wavelength of exposure light, a shift from a 365-nm i-line to KrF excimer laser light having an oscillation wavelength around 248 nm is in progress, and an ArF excimer laser having an oscillation wavelength around 193 nm is under development. A fluorine ($F_2$) excimer laser having an oscillation wavelength around 157 nm is also under development.

On the other hand, a projection exposure technique using a liquid immersion method as a technique for increasing the resolving power independently of the above methods is receiving a great deal of attention. The conventional methods fill, with a gas, the space between the last surface of a projection optical system and the surface of an exposure target substrate (e.g., a wafer). However, the liquid immersion method executes projection exposure while filling that space with a liquid. Assume, for example, that the liquid immersion method uses pure water (refractive index; 1.33) as the liquid to be supplied to the space between the projection optical system and the wafer, and sets the maximum incident angle of a light beam imaged on the wafer equal to that in the conventional methods. In this case, the liquid immersion method can advantageously attain a resolution 1.33 times that in the conventional methods, even by using a light source having the same wavelength. This amounts to increasing the NA of the projection optical system in the conventional methods to 1.33 times. The liquid immersion method can attain a resolving power whose NA is one or more, which is practically impossible in the conventional methods.

An attempt to apply the liquid immersion method to an exposure apparatus is recently in progress (Japanese Patent Application Laid-Open No. 06-124873).

FIG. 8A is a view showing the structure of the exposure apparatus disclosed in Japanese Patent Application Laid-Open No. 06-124873.

Referring to FIG. 8A, an illumination optical system 103 illuminates the pattern of a reticle 101 to project and to form by exposure that pattern on a wafer 102 through a projection optical system 104. A reticle stage 105 moves the reticle 101. Filling a liquid tank (chamber) 109 with a liquid 130 provides the ability to fill, with the liquid 130, the space between the wafer 102 and the end face (optical element 107) of the projection optical system 104. The liquid tank 109 accommodates a wafer conveyance device, wafer chuck 112, X-Y stage 113, fine moving stage 114, and part or all of each of coarse alignment devices 111-1 to 111-4. The wafer conveyance device loads the wafer 102 from a wafer cassette 110 and sets it on a wafer chuck 112. Reference numeral 115 denotes a laser interferometer. A reference mirror 116 is attached to the surface of the fine moving stage 114 along the X and Y directions (the Y direction is not shown), and reflects light from the laser interferometer 115 to measure the position of the fine moving stage 114. The liquid tank 109 has a window 117 to pass light from the laser interferometer 115. A heat-insulating material 118 is formed outside the liquid tank 109 and thermally insulates it from outside.

As shown in FIG. 8B, Japanese Patent Application Laid-Open No. 06-124873 describes another arrangement example of the exposure apparatus designed to mount the liquid tank 109 on the fine moving stage 114 while placing, in the liquid tank 109, only constituent parts including the wafer chuck 112 or while directly placing the wafer chuck 112 on the bottom surface of the liquid tank 109. That is, Japanese Patent Application Laid-Open No. 06-124873 describes the exposure apparatus using a method of mounting, in the liquid tank 109, the whole wafer 102 and the end face of the projection optical system 104.

WO99/49504 shows another example in which the liquid immersion method is applied to an exposure apparatus. WO99/49504 describes a method of supplying a liquid to only the space between a projection optical system and the surface of a wafer so as to fill that space.

FIG. 9 is a block diagram showing the arrangement of an inline connection between an exposure apparatus and a coating/developing device. Upon receiving a wafer from a coating/developing device 122, a wafer conveyance robot of an exposure apparatus 123 transfers that wafer to an exposure stage 125. The same robot also transfers an exposed wafer to the coating/developing device 122. Even in the coating/developing device 122, a robot to transfer a wafer coated with a resist to an exposure apparatus side interface unit 124 transfers the exposed wafer to a heater (Japanese Patent Application Laid-Open No. 2002-57100).

Unfortunately, the conventional exposure apparatuses suffer from local defocusing, which arises from the dropping, onto the wafer chuck, or the like, upon wafer transfer, of a liquid adhering to the surface of the wafer. This results in a decrease in yield. Furthermore, the wafer chuck requires replacement while stopping the apparatus for a long period of time, which has a great influence on the device production. When the robot transfers an exposed wet wafer, the liquid adheres to its hand and then adheres to an unexposed wafer to be transferred next. This may cause transfer of foreign substances among wafers (to be referred to as cross-contamination hereinafter). As a consequence, local defocusing arises, resulting in a decrease in yield.

Furthermore, when the robot transfers a wafer having a liquid adhered on it to the coating/developing device to heat that wafer, temperature non-uniformity occurs due to heat generated as the liquid evaporates. This degrades the CD uniformity. On the other hand, the practical application of high-speed spin drying in consideration of a case wherein all exposed wafers are wet complicates the structure of the exposure apparatus. This increases the cost and decreases the throughput as well.

SUMMARY OF THE INVENTION

The present invention has been made in consideration of the above background, and has as its exemplary object to provide a novel technique for reducing inconveniences due to a liquid remaining on a substrate and/or a substrate stage.

In order to achieve the above object, according to the present invention, there is provided an exposure apparatus, comprising:

a projection optical system configured to project light from a reticle onto a substrate, wherein the apparatus is configured to expose the substrate to light with a space between the projection optical system and the substrate filled with liquid;

a stage configured to hold the substrate and to move;

a supply unit configured to supply the liquid to the space;

a recovery unit configured to recover the liquid from the space; and a detector configured to detect the liquid on at least one of the substrate and the stage, wherein the detector is configured to detect the liquid conveyed along a conveyance path along which the substrate is conveyed from a position below the projection optical system to a position from which the substrate is conveyed out from the exposure apparatus.

There is also provided a method of manufacturing a device, the method comprising steps of:

exposing a substrate to light via a reticle using an exposure apparatus as defined above;

developing the exposed substrate; and processing the developed substrate to manufacture the device.

According to the present invention, it is possible to provide a novel technique for reducing inconveniences due to a liquid remaining on a substrate and/or a substrate stage.

Further features of the present invention will become apparent from the following description of exemplary embodiments (with reference to the attached drawings).

BRIEF DESCRIPTION OF THE DRAWINGS

FIG. 1A is a view showing the outline of the structure of an exposure apparatus according to the first embodiment of the present invention;

DESCRIPTION OF THE EMBODIMENTS

Figure 1B:
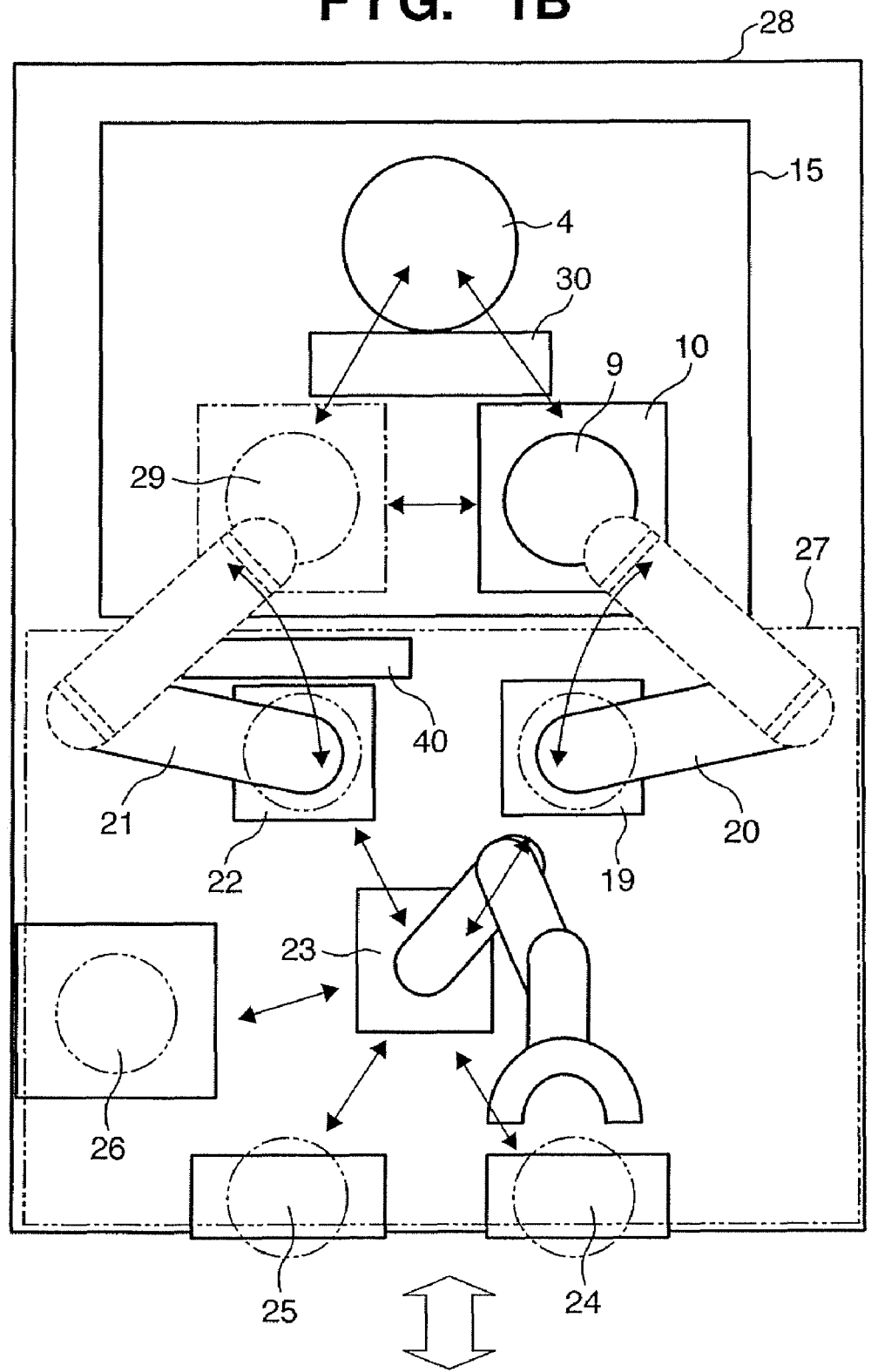
FIG. 1B is a plan view of the exposure apparatus when seen from the wafer transfer height and schematically shows a wafer transfer process in the first embodiment.

Embodiments according to the present invention will be described in detail below with reference to the accompanying drawings.

Note that the embodiments to be described hereinafter are merely practical examples of the present invention and can be appropriately modified or changed in accordance with various conditions and the arrangement of an apparatus to which the present invention is applied.

For example, the present invention is effective for all exposure methods and apparatuses to which a liquid immersion method is applied, which uses ultraviolet light as exposure light and fills, with a liquid, the space between a projection optical system and a substrate (e.g., a wafer). Exposure apparatuses of this type may include, e.g., an exposure apparatus which projects and transfers the pattern of an original plate (e.g., a mask or reticle) onto a stationary substrate, and an exposure apparatus which forms by scanning exposure the pattern of an original plate on a substrate using slit light while synchronously scanning the substrate and the original plate.

First Embodiment

The first embodiment according to the present invention will be explained below.

FIG. 1A is a view showing the outline of the structure of an exposure apparatus according to the first embodiment of the present invention.

Referring to FIG. 1A, an exposure light source (not shown), such as an ArF excimer laser or an $F_2$ laser, supplies light to an illumination optical system 2. The illumination optical system 2 partially illuminates a reticle (original plate) 1 with the light which is supplied from the exposure light source and formed into slit light (light having a slit-shaped cross section). While the illumination optical system 2 illuminates the reticle 1 with the slit light, a reticle stage (original plate stage) 3, which holds the reticle 1 and a wafer stage (substrate stage), which holds a wafer (substrate) 9 move by scanning in synchronism with each other. The sync scanning provides the ability to continuously image, on the wafer 9, the entire pattern on the reticle 1 through a projection optical system 4 so as to expose the resist applied to the surface of the wafer 9 to light.

A reference mirror 11 and laser interferometer 12 measure the two-dimensional positions of a reticle stage 3 on a surface plate 14 and a wafer stage 10 on a surface plate 15 in real time. On the basis of the measured value, a stage controller 13 aligns and synchronously controls the reticle 1 (reticle stage 3) and the wafer 9 (wafer stage 10). The wafer stage 10 incorporates a driving device to adjust, change, or control the position along the up/down direction (vertical direction), the rotational direction, and the inclination of the wafer 9. In exposure, the driving device controls the wafer stage 10 such that the exposure area on the wafer 9 always matches the focal plane of the projection optical system 4 with high accuracy. At this time, a light focus sensor (not shown) measures the surface position (the inclination and the position along the up/down direction) of the wafer 9 and sends the measurement result to the stage controller 13.

An environment chamber 28 accommodates the constituent components of the exposure apparatus to hold its ambient gas at a predetermined temperature. The blowing of a conditioned gas, further separately temperature-controlled into the space which surrounds the reticle stage 3, wafer stage 10, and laser interferometer 12, provides the ability to maintain the ambient temperature with a higher accuracy. A wafer conveyance unit 27 is installed on the front side of the exposure apparatus.

A wafer transfer process will be explained next with reference to FIGS. 1A and 1B.

FIG. 1B is a plan view of the interior of the exposure apparatus when seen from above and schematically shows a wafer transfer process in the preferred embodiment according to the present invention.

A wafer conveyance device (not shown) of a coating/developing device causes a conveyance robot 23 to transfer a wafer arranged on a wafer transfer position 24 to a prealignment unit 19. The prealignment unit 19 supports and aligns the wafer in the horizontal and rotational directions. The supply robot 20 then transfers the wafer from the prealignment unit 19 to the wafer stage 10. The wafer moves to an exposure start position immediately below the projection optical system 4 while being held by the wafer stage 10. In the vicinity of the exposure start position, a liquid supply nozzle 5 supplies a liquid onto the wafer 9.

After that, the exposure apparatus performs exposure by the above-described liquid immersion method. After completing exposure, a liquid recovery nozzle 6 recovers the liquid on the wafer 9. The wafer moves from below the liquid recovery nozzle 6 to a wafer recovery position 29 while being held by the wafer stage 10. One nozzle may serve both as a liquid supply nozzle and a liquid recovery nozzle, as needed. In this case, a droplet detector 30 is arranged on the moving path of the wafer stage 10. On a path to transfer the wafer from below the liquid recovery nozzle 6 to a wafer recovery station 22, the droplet detector 30 detects whether the liquid adheres to the surface of the wafer. A recovery robot 21 transfers the wafer at the wafer recovery position 29 to the wafer recovery station 22. A droplet removing unit 40 is arranged on a path to transfer the wafer from the wafer recovery position 29 to the wafer recovery station 22.

The conveyance robot 23 transfers the wafer on the wafer recovery station 22 to a wafer transfer position 25. The wafer conveyance device (not shown) of the coating/developing device transfers the wafer on the wafer transfer position 25 to the coating/developing device. Instead of receiving the wafer provided from the coating/developing device, the conveyance robot 23 may take out an unexposed wafer from a wafer carrier 26 to transfer it to the prealignment unit 19, and, additionally, may transfer an exposed wafer from the wafer recovery station 22 to accommodate it in the wafer carrier 26. In either case, the conveyance robot 23 transfers both an unexposed wafer and an exposed wafer.

This embodiment can practice, for example, using the liquid supply nozzle 5 and liquid recovery nozzle 6, a liquid immersion exposure technique for filling, with a liquid, the space or gap between the projection optical system 4 and the wafer 9. The liquid supply nozzle 5 is arranged above the wafer 9 to be close to the projection optical system 4. The liquid recovery nozzle 6 is arranged on the opposite side of the liquid supply nozzle 5 through the projection optical system 4.

The liquid immersion exposure technique to be performed in this embodiment will be described in detail below.

Referring to FIG. 1A, the liquid supply nozzle 5 is arranged to be close to the projection optical system 4 on the upstream side in a direction in which the exposure apparatus scans the wafer 9 during exposure. In this case, assuming, for example, that the wafer moves from right to left, i.e., in the left direction (second direction), the upstream side of the scanning direction indicates the right side, i.e., a direction (first direction) opposite to the left direction. That is, the upstream side indicates the direction (first direction) on the side of the origin of an arrow which indicates the scanning direction (second direction). The liquid recovery nozzle 6 is arranged on the opposite side (that is, the downstream side in the scanning direction) of the liquid supply nozzle 5 through the projection optical system 4.

The liquid supply nozzle 5 is connected to a liquid supply device 7 through a supply conduit 16. Similarly, the liquid recovery nozzle 6 is connected to a liquid recovery device 8 through a recovery conduit 17. The liquid supply device 7 may include, e.g., a tank which stores a liquid, a pressure feed device which feeds the liquid, and a flow controller which controls the flow rate of the liquid to be supplied. Preferably, the liquid supply device 7 further includes a temperature controller to control the temperature of the liquid to be supplied. The liquid recovery device 8 may include, e.g., a tank which temporarily stores the recovered liquid, a suction device which draws the liquid by suction, and a flow controller to control the flow rate of the liquid to be recovered. A liquid immersion controller 18 receives information about the current position, velocity, acceleration, target position, and moving direction of the wafer stage 10. On the basis of the information about these factors, the liquid immersion controller 18 gives a command to start/stop liquid immersion or to control the flow rate of the liquid to the liquid supply device 7 and liquid recovery device 8.

A process for filling, with a liquid, the space between the projection optical system 4 and the wafer 9 will be explained next.

While the wafer 9 is still or in motion, the liquid supply nozzle 5 supplies a liquid F onto the wafer 9 at, e.g., an almost constant flow rate so as to bring the liquid in tight contact with the lower surface of the liquid supply nozzle 5 and the upper surface of the wafer 9, thus forming a sufficient liquid film between them. While the liquid supply nozzle 5 continues to supply the liquid, the wafer 9 starts moving without breaking the formed liquid film. When the wafer 9 reaches an exposure start position, scanning exposure using slit light starts. When the wafer 9 further moves and reaches an exposure end position, exposure using slit light ends. After completing exposure using slit light, supply of the liquid from the liquid supply nozzle 5 stops. The liquid recovery nozzle 6 recovers the residual liquid while moving the wafer 9 in the scanning direction. As described above, the method of continuously supplying the liquid onto the surface of the wafer 9 while moving the wafer 9 so that the liquid film expands can fill, with a continuous liquid film (unbroken liquid film), the gap between the wafer 9 and a last surface 4s of the projection optical system 4. Also, this method can surely recover the liquid through the liquid recovery nozzle 6 because the relative velocity of the liquid film to the wafer is small.

The above-described liquid immersion exposure normally recovers all droplets on an exposed wafer. However, a droplet adhering to the liquid recovery nozzle 6 or the last surface 4s of the projection optical system 4 may drop onto the wafer. Even though this phenomenon is unlikely to occur, a further dropping of the droplet which has dropped onto the wafer causes local defocusing, resulting in a decrease in yield. The wafer chuck requires replacement while stopping the apparatus for a long period of time, which has a great influence on the device production. When the robot transfers an exposed wet wafer, if the liquid adheres to its hand and then adheres to an unexposed wafer to be transferred next, cross-contamination arises. This causes local defocusing and decreases the yield. Furthermore, when the robot transfers a wafer having a liquid adhered to it to the coating/developing device to heat that wafer, temperature non-uniformity occurs due to heat generated as the liquid evaporates. This poses a problem in terms of the process that the CD uniformity degrades. On the other hand, the practical application of high-speed spin drying in consideration of a case wherein all exposed wafers are wet complicates the structure of the exposure apparatus. This increases the cost and decreases the throughput as well.

To solve these problems, this embodiment provides the droplet detector 30 and droplet removing unit 40 in order to detect and to remove a droplet on a wafer. The droplet detector 30 detects a droplet on the wafer. The droplet removing unit 40 removes the droplet on the wafer.

Figure 2A:
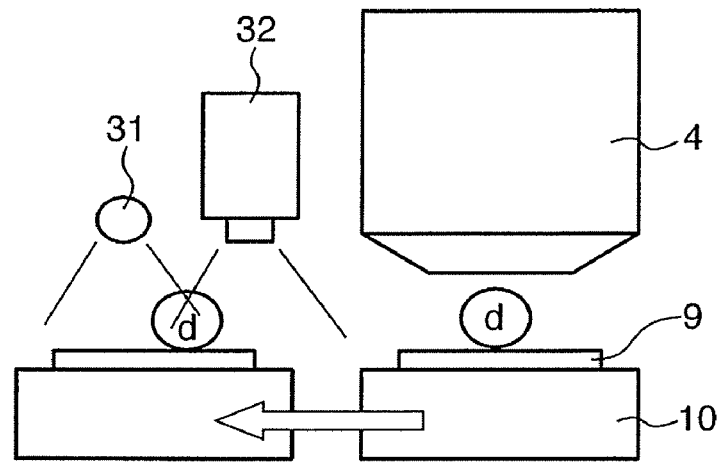
FIGS. 2A to 2C are views showing the practical arrangement of a droplet detector according to the first embodiment.

FIG. 2A is a view showing the practical arrangement of the droplet detector 30 according to this embodiment.

As shown in FIG. 2A, the droplet detector 30 comprises an irradiation device 31 and a light receiving device 32. The irradiation device 31 adopts an infrared light source. The light receiving device 32 adopts a CCD camera. Besides the infrared light source, the lighting device preferably adopts a light source having a wavelength long enough not to expose a resist, such as a laser beam source, a laser sheet beam source, a laser scan beam source, an LED, or a yellow-filtered light bulb. The light receiving device preferably adopts a light receiving element sensitive to the wavelength of the light source in the irradiation device 31, such as a two-dimensional sensor, such as a CCD or CMOS, a one-dimensional sensor, such as a line sensor, or a photoelectric sensor.

The irradiation device 31 emits infrared light using an electronic flash toward the wafer, which has undergone liquid immersion exposure and is moving from below the liquid recovery nozzle 6 to the wafer recovery position 29, while being held by the wafer stage 10. The CCD camera in the light receiving device 32 then captures images of the wafer 9 and a droplet d on it. In this embodiment, the CCD camera has a field of view which allows full-plate recording of the entire surface of the wafer stage. However, even if the CCD camera has a narrow field of view or cannot observe the entire surface of the wafer because of a shadow of the projection lens, or the like, it can divide and record the surface of the wafer 9 by continuous shooting in synchronism with the movement of the wafer stage 10. This makes it possible to detect droplets on the entire surface of the wafer. It is possible to obtain a similar effect even when the CCD camera divides and records the surface of the wafer 9 while changing its orientation to put the images together later by image processing. Even when the light receiving element adopts a one-dimensional sensor, such as a line sensor in place of a two-dimensional sensor such as a CCD or CMOS, it is possible to detect droplets on the entire surface of the wafer by controlling the movement of the wafer stage 10 or the orientation of the light receiving device to relatively move the wafer 9 and the light receiving device 32. An image processor (see FIG. 3) calculates the position and size of a droplet found in the image captured by the CCD camera.

Figure 2B:
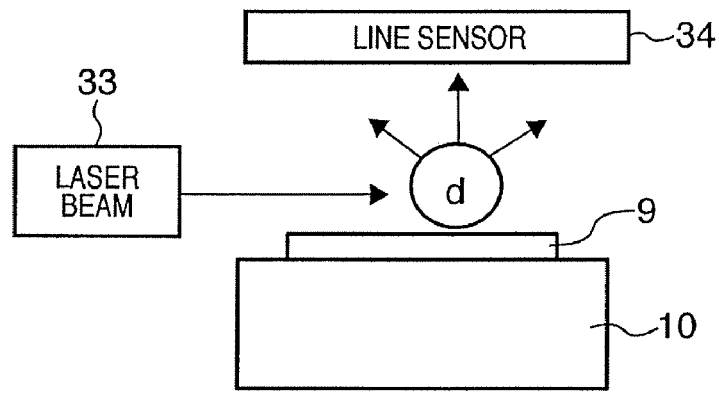

FIG. 2B illustrates a droplet detector using a laser beam source as the lighting device and a line sensor as the light receiving device. The lighting device irradiates, with a laser beam 33 parallel to the upper surface of the wafer 9, the vicinity of the surface of the wafer. A line sensor 34 aligns its longitudinal direction parallel to the wafer surface and the laser beam 33. Moving the wafer stage 10 in a direction perpendicular to the longitudinal direction of the line sensor 34 makes it possible to scan the entire surface of the wafer. The line sensor 34 can detect that a droplet exists on the wafer 9 when receiving a laser beam which scatters upon striking the droplet.

Figure 2C:
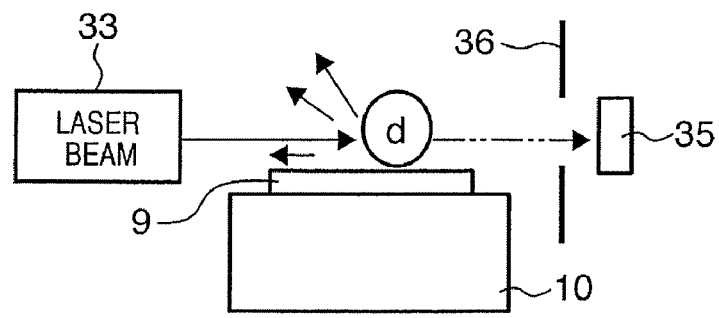

FIG. 2C illustrates a droplet detector using a laser beam source as the lighting device and a photoelectric sensor 35 as the light receiving device. The lighting device irradiates, with a laser beam 33 parallel to the upper surface of the wafer 9, the vicinity of the surface of the wafer. The photoelectric sensor 35 is so arranged as to be able to receive the laser beam 33 and is provided with a field stop 36 to prevent light from turning behind. Moving the wafer stage 10 in a direction perpendicular to a direction in which the lighting device emits the laser beam 33 makes it possible to scan the entire surface of the wafer. The photoelectric sensor 35 can detect that a droplet exists on the wafer when receiving no light, because a laser beam 33 has struck the droplet and been reflected on its entrance side.

A droplet detection process for calculating the position and size of a droplet on a wafer using an image captured by the light receiving device will be explained next.

Figure 3:
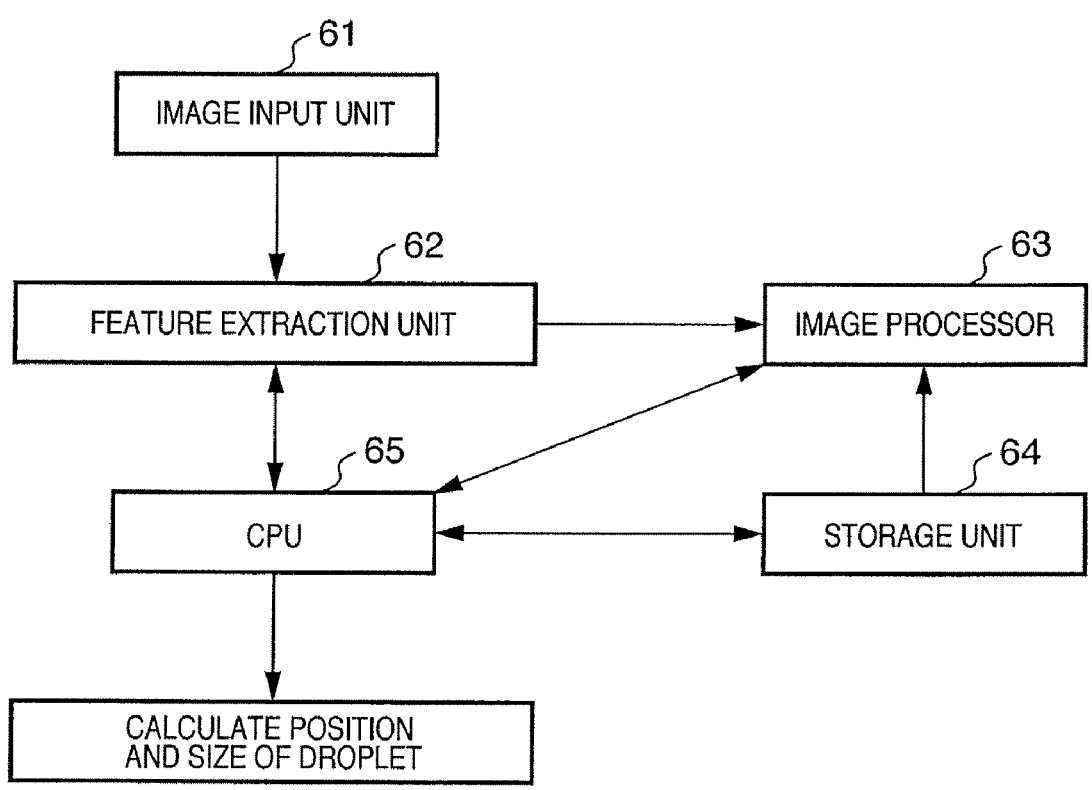
FIG. 3 is a block diagram showing a droplet detection process for determining the position and size of a droplet on a wafer according to the first embodiment.

FIG. 3 is a block diagram showing a droplet detection process for determining the position and size of a droplet on a wafer according to this embodiment.

Referring to FIG. 3, the light receiving device as an image input unit 61 sends an image captured by itself to a feature extraction unit 62. The feature extraction unit 62 extracts a feature of the image, i.e., a local feature element, from the received image. An image processor 63 compares the extracted feature with feature model data stored in a memory device 64 in advance. A CPU 65 extracts a droplet area (of which the feature is similar to the feature model data) from the comparison result and calculates the position and size of the droplet. For example, the CPU 65 searches for a shape similar to a droplet shape stored in advance, and determines the position and size of the droplet on the basis of its coordinate information.

Figure 4:
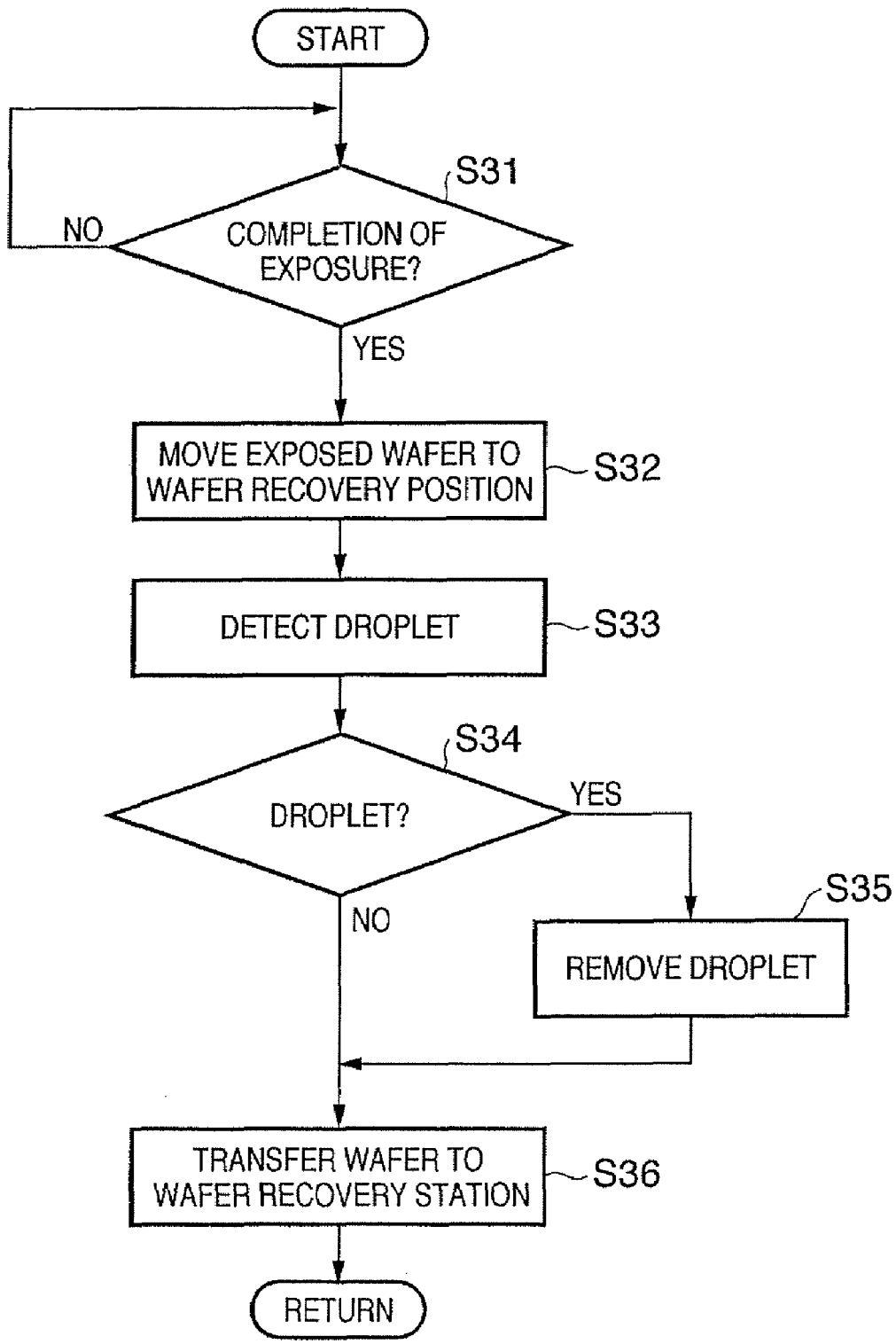
FIG. 4 is a flowchart showing a droplet detection process and a droplet removal process after completing exposure, according to the first embodiment.

FIG. 4 is a flowchart showing a droplet detection process and a droplet removal process after completing exposure according to this embodiment.

As shown in FIG. 4, after completing exposure in step S31, an exposed wafer undergoes the droplet detection process in step S33 when moving to the wafer recovery position 29 in step S32. If the CPU 65 determines in step S34 that a droplet exists, it activates the droplet removing unit (to be described later), to perform the droplet removal process when moving the exposed wafer to the wafer recovery station 22, in steps S35 and S36. If the CPU 65 determines that no droplet exists, the exposed wafer moves to the wafer recovery station 22 without performing the droplet removal process.

Figure 5:
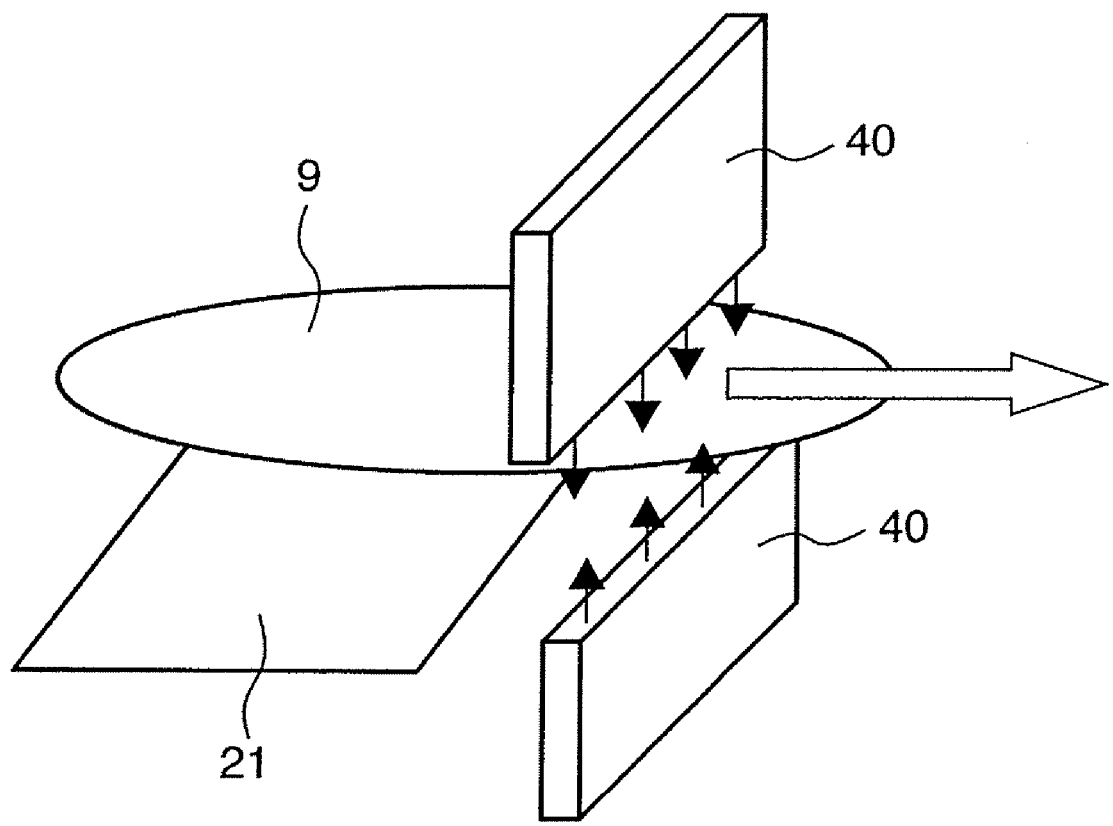
FIG. 5 is a view illustrating the outline of the structure of a droplet removing unit according to the first embodiment.

FIG. 5 is a view illustrating the outline of the structure of a droplet removing unit according to this embodiment.

As described with reference to FIG. 1B, the recovery robot 21 transfers the wafer at the wafer recovery position 29 to the wafer recovery station 22. The droplet removing unit 40 is arranged on the path to transfer the wafer from the wafer recovery position 29 to the wafer recovery station 22. The droplet removing unit 40 is so arranged as to vertically sandwich the wafer chucked and held by a hand of the recovery robot 21. When the wafer 9 chucked and held by the hand of the recovery robot 21 passes through the droplet removing unit 40, a nozzle having a slit-like opening portion vertically and linearly blows a high-pressure gas to remove a droplet (liquid) on the wafer 9. Liquid removal in this case means not only to perfectly remove the liquid, but also to remove the liquid to the extent that any liquid remaining after the removal does not disturb its subsequent processes. A liquid receiving cover (not shown) to prevent a droplet blown off from the wafer 9 from splashing over the other mechanical components is arranged below the droplet removing unit 40.

This embodiment adjusts the distance between the wafer 9 and the droplet removing unit 40 to 5 to 10 mm and the blowing gas flow rate to 100 L/min. However, the present invention is not limited to these numerical values, because a necessary distance and gas flow rate change depending on the length and width of the slit-like opening portion. Although this embodiment blows nitrogen gas, it is possible to obtain a desired effect even by blowing another inert gas or dry gas. From the viewpoint of prevention of contamination by chemical substances (also to be referred to as chemical contamination), the blowing of an inert gas is desirable.

This embodiment changes, using information about the position and size of a droplet detected by the droplet detection process, the moving velocity of a hand at the wafer recovery position 29. If a droplet exists on the wafer 9, the hand moves at a velocity less than a normal transfer velocity. Additionally, the hand moves at a normal velocity up to the place of the droplet and moves at a lower velocity from the place of the droplet. A prior removal evaluation obtained by changing the position and size of a droplet provides the ability to determine an optimal velocity corresponding to the position and size of the droplet. A storage unit (not shown) forms a table of the determination result and stores it. Sending the information about the position and size of the droplet to a robot controller (not shown) provides the ability to control the moving velocity of the hand at the wafer recovery position 29 in accordance with the table in the storage unit.

This embodiment controls the relative velocity between the droplet removing unit and the wafer to handle the position and size of a droplet. Alternatively, the exposure apparatus may control at least one of the distance between the droplet removing unit and the wafer, the blowing gas flow rate, and the gas blowing velocity. A droplet is unlikely to drop onto the wafer. Regardless of the control target, it is possible to process the wafer within a further shorter time than a time to remove droplets that are assumed to always adhere to the entire surface of the wafer. This technique is effective in increasing the throughput. This embodiment disposes the droplet removing unit 40 on the path to transfer the wafer from the wafer recovery position 29 to the wafer recovery station 22. However, the droplet removing unit 40 is preferably located on a path to transfer the wafer from the wafer recovery position 29 to the wafer transfer position 25. For example, it is possible to obtain a similar effect even by arranging the droplet removing unit 40 on the wafer recovery position 29, wafer recovery station 22, conveyance robot 23, or wafer transfer position 25.

A liquid immersion fluid for liquid immersion exposure in this embodiment adopts pure water. Although a droplet to be detected and removed is pure water, it is not limited to pure water. For example, a similar detection process and removal process are executable as far as the liquid immersion fluid for liquid immersion exposure adopts, e.g., perfluoropolyether.

Second Embodiment

The second embodiment according to the present invention will be explained below.

The first embodiment arranges the droplet removing unit 40 on the path to transfer the wafer from the wafer recovery position 29 to the wafer recovery station 22. Alternatively, the droplet removal process may use the liquid supply nozzle 5 and liquid recovery nozzle 6.

Figure 6:
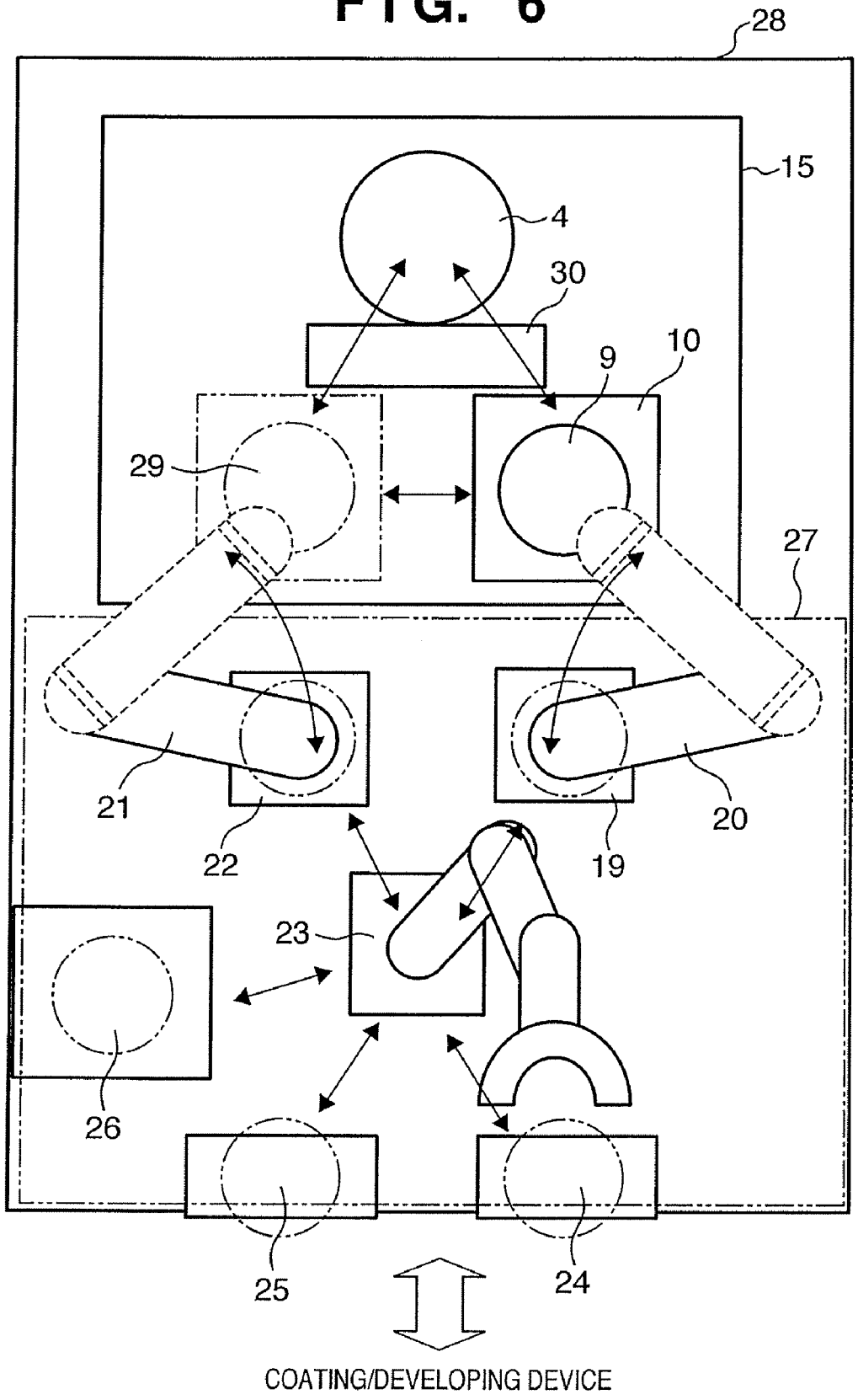
FIG. 6 is a plan view of an exposure apparatus when seen from the wafer transfer height and schematically shows a wafer transfer process in the second embodiment.

FIG. 6 is a plan view of the interior of an exposure apparatus when seen from above and schematically shows a wafer transfer process in the second embodiment. Although the basic apparatus arrangement and wafer transfer process are the same as those in the first embodiment, the second embodiment omits the droplet removing unit 40.

After completing exposure, a liquid recovery nozzle 6 recovers a liquid on a wafer 9. The wafer moves from below the liquid recovery nozzle 6 to a wafer recovery position 29 while being held by a wafer stage 10. A droplet detector 30 is arranged on a path to transfer the wafer from below the liquid recovery nozzle 6 to a wafer recovery station 22. When the wafer has reached the wafer recovery position 29, if a CPU 65 determines that no droplet exists on the wafer 9, a recovery robot 21 transfers the wafer at the wafer recovery position 29 to the wafer recovery station 22.

If the CPU 65 determines that a droplet exists on the wafer 9, it calculates the coordinate position of the movement destination of the wafer stage 10 in accordance with the position and size of the droplet. The wafer stage 10 moves below the liquid recovery nozzle 6 again to cause the liquid recovery nozzle 6 to recover the droplet on the wafer 9. After that, the wafer moves from below the liquid recovery nozzle 6 to the wafer recovery position 29 while being held by the wafer stage 10. The recovery robot 21 transfers the wafer at the wafer recovery position 29 to the wafer recovery station 22.

In this embodiment, when the recovery robot 21 is in the process of transferring the wafer at the wafer recovery position 29 to the wafer recovery station 22, the liquid recovery nozzle 6 has already removed a droplet from the surface of the wafer. This prevents the droplet on the wafer from dropping onto, e.g., a wafer chuck, or the like.

Third Embodiment

The third embodiment according to the present invention will be explained next.

The first embodiment uses the droplet removing unit 40 for the droplet removal process. Alternatively, dewatering for rotating the wafer at high speed may remove a droplet.

Figure 7:
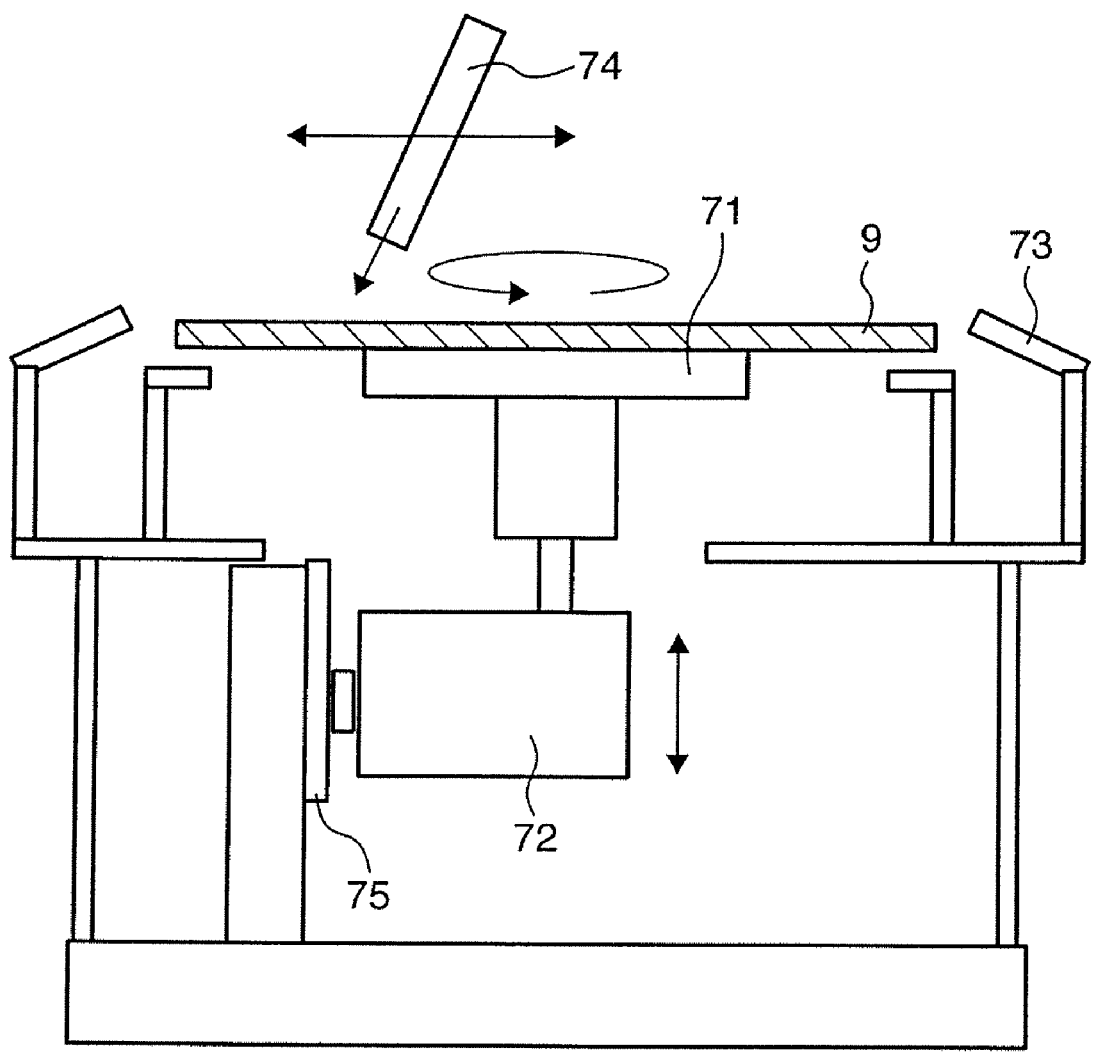
FIG. 7 is a side view showing the structure of a droplet removing unit according to the third embodiment of the present invention.
Figure 8A:
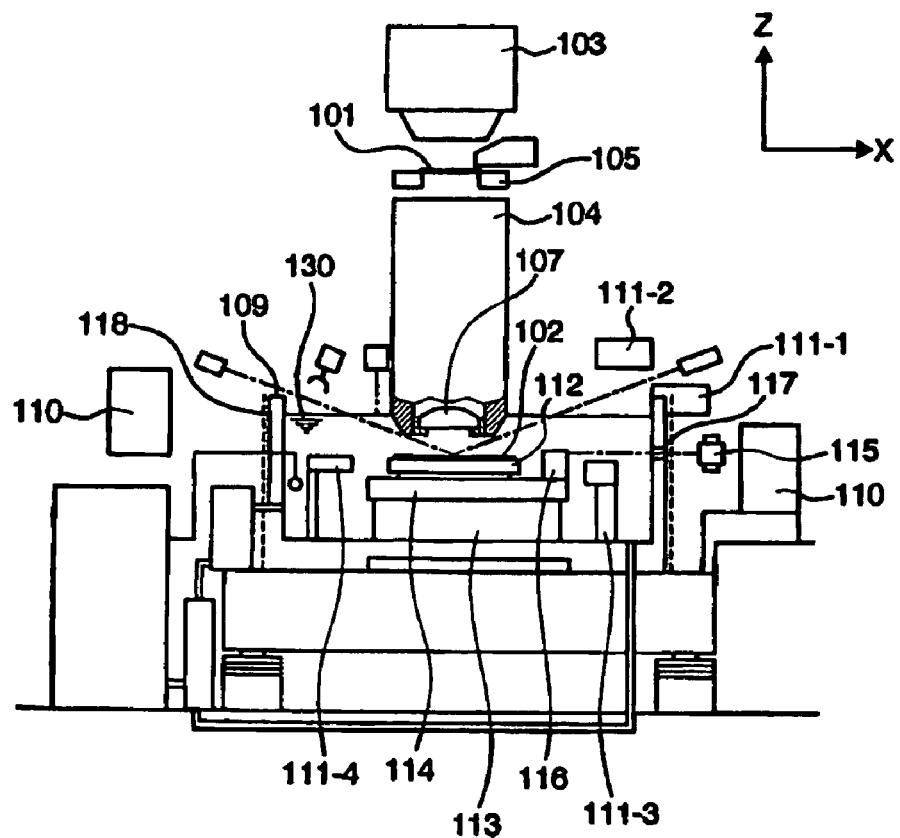
FIGS. 8A and 8B are views showing the outlines of the structures of the conventional liquid immersion exposure apparatuses.
Figure 8B:
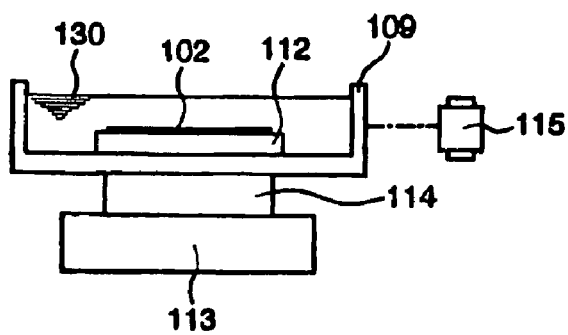
Figure 9:
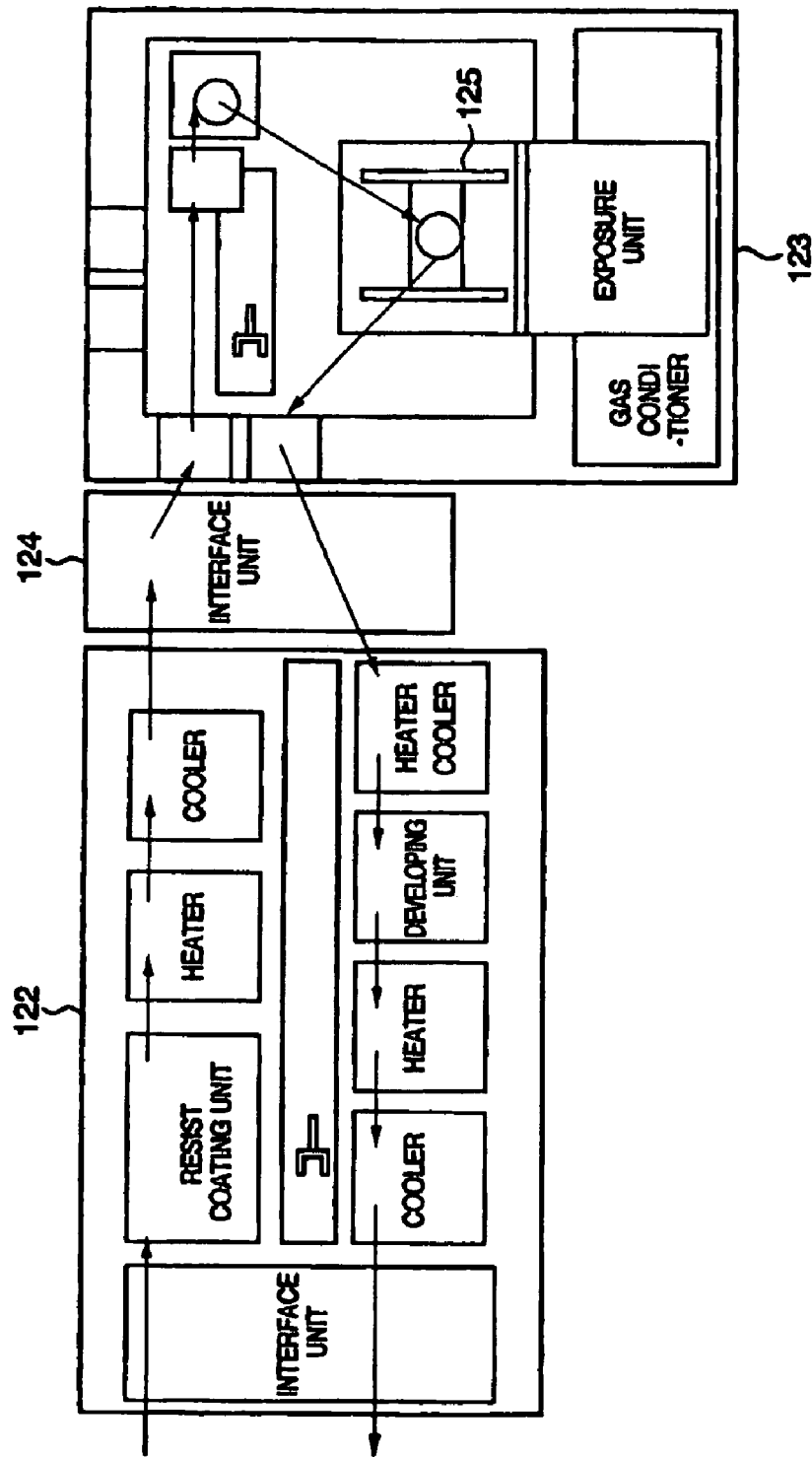
FIG. 9 is a block diagram showing the arrangement of an inline connection between the conventional liquid immersion exposure apparatus and a coating/developing device.

FIG. 7 is a side view showing the structure of a droplet removing unit according to the third embodiment of the present invention. The wafer transfer process and the basic arrangement of an exposure apparatus are the same as those shown in FIG. 6 of the second embodiment.

This embodiment arranges the droplet removing unit shown in FIG. 7 on a wafer recovery station 22. On the wafer recovery station 22, the droplet removing unit removes a droplet, if any, on a wafer.

As shown in FIG. 7, the droplet removing unit according to this embodiment comprises a wafer suction unit 71, which holds a wafer 9 transferred to the wafer recovery station 22 by a recovery robot 21. The wafer suction unit 71 is connected to a vacuum source (not shown) through an electromagnetic valve. The wafer suction unit 71 chucks by vacuum suction the wafer 9 transferred by the recovery robot 21.

A rotation motor 72 is attached to a lifting mechanism 75. The lifting mechanism 75 lowers the wafer 9 transferred by the wafer suction unit 71 up to the height of an antiscatter cover 73. The rotation motor 72 rotates the wafer suction unit 71 at 2,000 to 3,000 rpm so as to remove a droplet on the wafer 9 by utilizing a centrifugal force.

After droplet removal, the rotation motor 72 stops and lifts to cancel vacuum suction of the wafer suction unit 71 and then to transfer the wafer 9 to a conveyance robot 23. The droplet removing unit removes a droplet on the wafer by repeating the above operation. This embodiment controls the rotation time of the rotation motor 72 in accordance with information about the position and size of a droplet obtained by the above-described droplet detection process. Alternatively, changing one of the rotation time, rotation velocity, and acceleration of the wafer suction unit 71, or an arbitrary combination thereof, may provide the ability to execute control corresponding to the position and size of the droplet.

It is also possible to remove a droplet using a gas blowing nozzle 74 together with or as the droplet removing unit. In this case, preferably, controlling, in accordance with information about the position and size of the droplet obtained by the droplet detection process, one of the distance between the gas blowing nozzle 74 and the wafer 9, the flow rate and flow velocity of the blowing gas, the gas blowing time, and the nozzle scanning velocity, or an arbitrary combination thereof, provides the ability to execute control corresponding to the position and size of the droplet.

In this embodiment, the droplet removal process adopts the high-speed rotation mechanism or gas blowing mechanism arranged on the wafer recovery station 22. The mechanism is preferably located on a path to transfer the wafer from a wafer recovery position 29 to a wafer transfer position 25. For example, it is possible to obtain a similar effect even by arranging that mechanism on the wafer transfer position 25 or conveyance robot 23, or in a path to transfer the wafer from the wafer recovery position 29 to the wafer recovery station 22.

The droplet removing unit according to the present invention is not limited to the gas blowing mechanism, high-speed rotation mechanism, or the gas blowing mechanism, as long as it can appropriately remove a droplet on a wafer. For example, water removal by temperature rise or various kinds of dry cleaning implements provide the ability to remove a droplet on a wafer. The exposure apparatus may execute the above methods by arbitrarily combining them. The exposure apparatus preferably combines a plurality of removing units to remove a droplet which has entered the reverse surface side of a wafer.

Fourth Embodiment

As described above, liquid immersion exposure normally recovers all droplets on an exposed wafer. However, a droplet adhering to a liquid recovery nozzle 6 or a last surface 4s of a projection optical system 4 may drop onto the wafer. Even though this phenomenon is unlikely to occur, a further dropping of the droplet, which has dropped onto the wafer, upon transfer, causes local defocusing. This results in a decrease in yield. Furthermore, the wafer chuck requires replacement while stopping the apparatus for a long period of time, which has a great influence on the device production. When a droplet drops onto an alignment mark on the wafer stage or onto a reference mirror for a laser interferometer on the wafer stage, a measurement error occurs. This results in a decrease in yield.

To solve this problem, detection and removal of even droplets, which have dropped onto the wafer chuck, the alignment mark on the wafer stage, and the reference mirror for the laser interferometer on the wafer stage, are preferable. For this purpose, the exposure apparatus may comprise detectors and removing units dedicated to these components. However, this embodiment adopts a droplet detector 30 to detect droplets which have dropped onto the wafer chuck, the alignment mark on the wafer stage, and the reference mirror for the laser interferometer on the wafer stage.

Also, a droplet removal process adopts a droplet removing unit to remove the droplets which have dropped onto the wafer chuck, the alignment mark on the wafer stage, and the reference mirror for the laser interferometer on the wafer stage.

To practice the detection process and removal process, preferably, the detector and removing unit of droplets which have dropped onto the wafer chuck, the alignment mark on the wafer stage, and the reference mirror for the laser interferometer on the wafer stage are arranged on a path to transfer the wafer from a wafer recovery position 29 to a wafer transfer position 25. For example, the detector and removing unit are preferably arranged on the wafer recovery position 29, a wafer recovery station 22, a conveyance robot 23, or the wafer transfer position 25.

According to the above-described embodiments, it is possible to detect and to remove a droplet after completing exposure, so as to reduce inconveniences due to the presence of a liquid, such as prolongation of downtime of an exposure apparatus, and a decrease in yield.

It is also possible to lower the probability of degradation in performance of an inspection apparatus or a semiconductor manufacturing apparatus, which performs processes (e.g., a post-process), subsequent to exposure, and to simplify the structure of an exposure apparatus, thus increasing the throughput and downsizing the apparatus.

[Device Manufacturing Method]

An embodiment of a device manufacturing method using the above-described exposure apparatus will be explained next.

The following embodiment provides a device manufacturing method to which the exposure apparatus according to the present invention is applied. A semiconductor device manufacturing method will be exemplified here.

Figure 10:
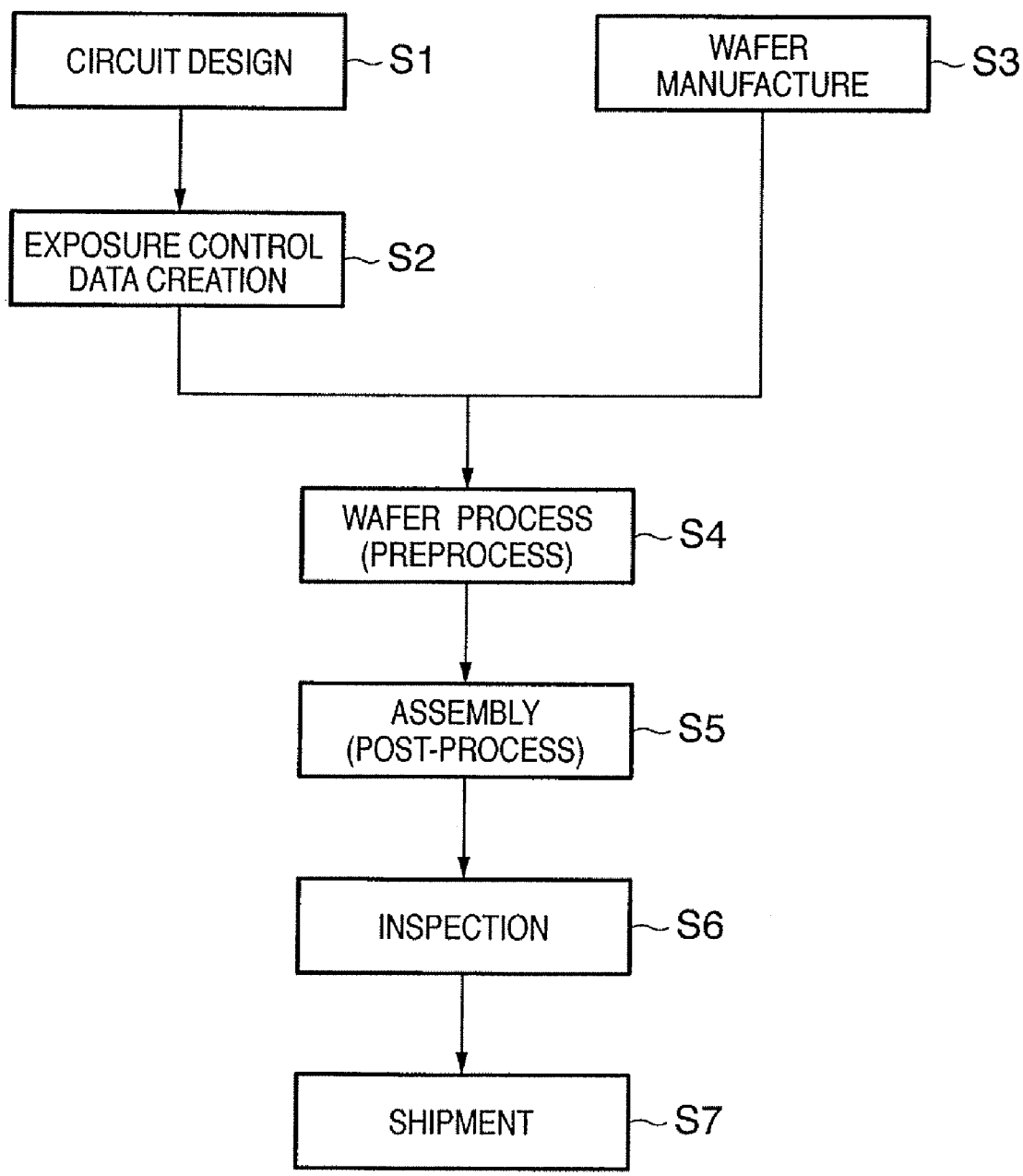
FIG. 10 is a flowchart showing the manufacturing procedure of a microdevice.

A semiconductor device manufacturing process using the above-described exposure apparatus will be described below. FIG. 10 is a flowchart showing the flow of the overall semiconductor device manufacturing process. In step S1 (circuit design), a semiconductor device circuit is designed. In step S2 (mask fabrication), a mask (also called an original plate or a reticle) is fabricated on the basis of the designed circuit pattern. In step S3 (wafer manufacture), a wafer (also called a substrate) is manufactured using a material such as silicon. In step S4 (wafer process), called a pre-process, an actual circuit is formed on the wafer by lithography using the mask and wafer. In step S5 (assembly), called a post-process, a semiconductor chip is formed by using the wafer manufactured in step S4. This step includes an assembly step (dicing and bonding) and a packaging step (chip encapsulation). In step S6 (inspection), the semiconductor device manufactured in step S5 undergoes inspections, such as an operation confirmation test and a durability test. After these steps, the semiconductor device is completed and shipped (step S7).

Figure 11:
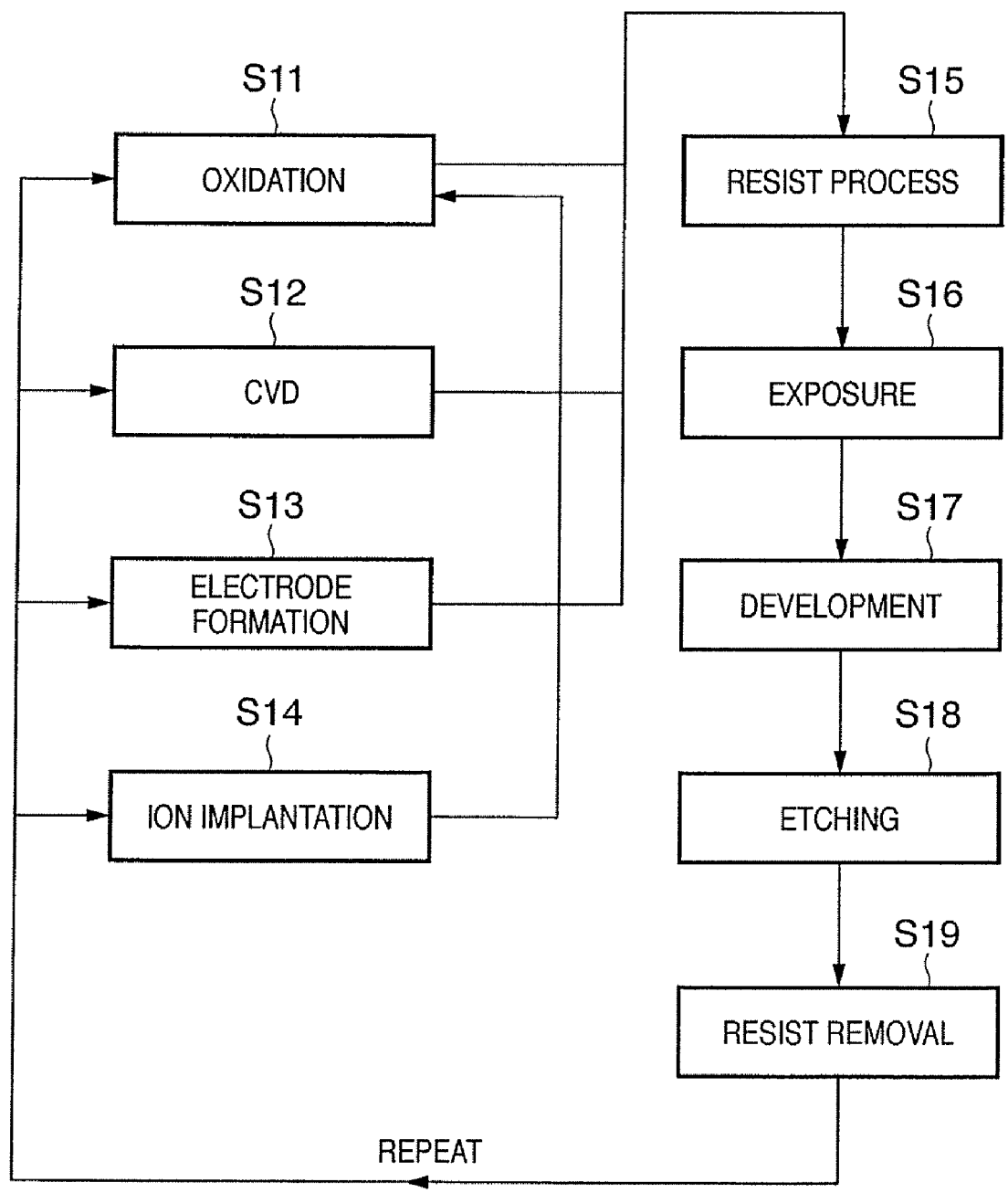
FIG. 11 is a flowchart for explaining the wafer process.

FIG. 11 shows the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the exposure apparatus according to the present invention is caused to expose the wafer, on which the resist is coated, to radiation via the mask on which the circuit pattern is formed, to form a latent image pattern. In step S17 (development), the latent image pattern formed on the wafer coated with the photosensitive agent is developed. In step S18 (etching), portions other than the developed resist image are etched. In step S19 (resist removal), any unnecessary resist remaining after etching is removed. These steps are repeated to form multiple circuit patterns on the wafer.

When the production method of this embodiment is used, a semiconductor device with a high degree of integration, which is conventionally difficult to manufacture, can be manufactured at low cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-296959, filed Oct. 11, 2005, which is hereby incorporated by reference herein in its entirety.

What is claimed is:

1. An exposure apparatus, comprising:
   a projection optical system configured to project light from a reticle onto a substrate, wherein the apparatus is configured to expose the substrate to light with a space between the projection optical system and the substrate filled with liquid;
   a stage configured to hold the substrate and to move;
   a supply unit configured to supply the liquid to the space;
   a recovery unit configured to recover the liquid from the space;
   a detector configured to detect a droplet of the liquid on at least one of the substrate and the stage;
   a removing unit configured to remove the droplet on the substrate detected by said detector, the removing unit including a slit-shaped nozzle arranged so as to vertically sandwich the substrate and blowing a gas on the substrate from the nozzle;
   a calculation unit configured to calculate at least one of a position and size of the droplet detected by said detector; and
   a controller configured to control a relative velocity between the nozzle of said removing unit and the substrate based on a calculation result of said calculation unit,
   wherein said detector is configured to detect the liquid conveyed along a conveyance path along which the substrate is conveyed from a position below said projection optical system to a position from which the substrate is conveyed out from said exposure apparatus.

2. An apparatus according to claim 1, wherein said detector and said removing unit are configured to operate for the liquid conveyed along the conveyance path.

3. A method of manufacturing a device, said method comprising steps of:
   exposing a substrate to light via a reticle using an exposure apparatus as defined in claim 1;
   developing the exposed substrate; and
   processing the developed substrate to manufacture the device.

* * * * *